United States Patent
Gashkov et al.

(10) Patent No.: US 9,417,847 B2
(45) Date of Patent: Aug. 16, 2016

(54) LOW DEPTH COMBINATIONAL FINITE FIELD MULTIPLIER

(75) Inventors: Sergey B. Gashkov, Moscow (RU); Anatoli A. Bolotov, San Jose, CA (US); Mikhail I. Grinchuk, San Jose, CA (US); Lav D. Ivanovic, Sunnyvale, CA (US); Anatoly A. Chasovshikh, Moscow (RU); Alexei V. Galatenko, Moscow (RU); Igor V. Kucherenko, Moscow (RU)

(73) Assignee: Intel Corporation, Santa Clara, CA (US)

( * ) Notice: Subject to any disclaimer, the term of this patent is extended or adjusted under 35 U.S.C. 154(b) by 777 days.

(21) Appl. No.: 13/231,129

(22) Filed: Sep. 13, 2011

(65) Prior Publication Data
US 2012/0226731 A1 Sep. 6, 2012

(30) Foreign Application Priority Data

Mar. 1, 2011 (RU) .................................. 2011107568

(51) Int. Cl.
*G06F 7/72* (2006.01)
*G06F 17/50* (2006.01)

(52) U.S. Cl.
CPC .............. *G06F 7/724* (2013.01); *G06F 17/505* (2013.01)

(58) Field of Classification Search
CPC .................................. G06F 7/523; G06F 7/722
USPC .......................................... 708/620, 491–492
See application file for complete search history.

(56) References Cited

U.S. PATENT DOCUMENTS

| | | | |
|---|---|---|---|
| 4,847,801 A | 7/1989 | Tong | 364/746.1 |
| 4,918,638 A | 4/1990 | Matsumoto et al. | 364/746.1 |
| 5,594,657 A * | 1/1997 | Cantone et al. | 716/104 |
| 6,473,779 B1 | 10/2002 | Wolf | 708/492 |
| 6,760,742 B1 | 7/2004 | Hoyle | 708/492 |
| 6,917,218 B2 | 7/2005 | Kim et al. | 326/38 |
| 7,089,276 B2 | 8/2006 | Miller et al. | 708/492 |
| 7,133,889 B2 | 11/2006 | Parthasarathy et al. | 708/492 |
| 7,136,892 B2 | 11/2006 | Feuser | 708/492 |
| 7,177,891 B2 | 2/2007 | Stein et al. | 708/492 |
| 7,346,159 B2 | 3/2008 | Gura et al. | 380/28 |
| 7,403,964 B2 | 7/2008 | Porten et al. | 708/492 |

(Continued)

OTHER PUBLICATIONS

Syunji Yazaki and Koki Abe, VLSI Design of Iterative Karatsuba Multiplier and Its Evaluation, Department of Computer Science, The University of Electro-Communications, 2006, pp. 1-6.*

(Continued)

*Primary Examiner* — Matthew Sandifer
(74) *Attorney, Agent, or Firm* — Nicholson De Vos Webster & Elliott LLP (57) ABSTRACT

A method for generating a design of a multiplier is disclosed. The method generally includes steps (A) to (C). Step (A) may generate a first circuit comprising a plurality of polynomial results of a particular multiplier scheme based on a plurality of parameters of the multiplier. The first circuit is generally configured to multiply a plurality of polynomials. Step (B) may generate a second circuit comprising a plurality of polynomial evaluators based on the parameters. The second circuit may be (i) connected to the first circuit and (ii) configured to evaluate a polynomial modulo operation. Step (C) may generate the design of the multiplier in combinational logic by optimizing a depth of a plurality of logic gates through the first circuit and the second circuit. A product of the polynomials generally resides in a finite field.

10 Claims, 10 Drawing Sheets

(56) References Cited

U.S. PATENT DOCUMENTS

| | | | | |
|---|---|---|---|---|
| 7,461,115 | B2 | 12/2008 | Eberle et al. | 708/491 |
| 7,650,374 | B1* | 1/2010 | Gura | G06F 7/53 708/620 |
| 7,765,252 | B1 | 7/2010 | Montgomery | 708/620 |
| 2007/0299899 | A1* | 12/2007 | Hasenplaugh | G06F 7/5324 708/620 |
| 2008/0091386 | A1* | 4/2008 | Baumgartner et al. | 703/1 |

OTHER PUBLICATIONS

Donald Knuth, The Art of Computer Programing Section 7.2.1.6: Generating All Trees, vol. 4, Stanford University, 2005, pp. 1-87.*

Daniel J. Bernstein, Batch Binary Edward, Department of Computer Science, The University of Illinois at Chicago, 2009, pp. 317-336.*

Christof Paar, A New Architecture for a PArallel Finite Field Multiplier with Low Complexity Based on Composite Fields, IEEE Transactions on Computers, vol. 45, No. 7, Jul. 1996, pp. 856-861.*

Paar C., Fleischmann P. and Roelse P., "Efficient Multiplier Architectures of Galois Fields GF (24n)", IEEE Transactions on Computers, vol. 47, No. 2, pp. 162-170, 1998.*

T. Shankar and G.Sahoo, "Cryptography by Karatsuba Multiplier with ASCII Codes", International Journal on Computer Applications, pp. 53-60, 2010.*

S. S Yazaki and K.Abe, "VLSI implementation of Karatsuba algorithm and its evaluation," Proc. The International Workshop on Modern Science and Technology 2006, pp. 378-383, May 2006.*

Mancillas-Lopez, C., et al., "Reconfigurable Hardware Implementations of Tweakable Enciphering Schemes", IEEE Xplore Digital Library, IEEE Transactions on Computers, vol. 59, Issue 11, Mar. 18, 2010, pp. 1-36.

* cited by examiner

LOW DEPTH COMBINATIONAL FINITE FIELD MULTIPLIER

This application claims the benefit of Russian Application No. 2011107568, filed Mar. 1, 2011 and is hereby incorporated by reference in its entirety.

FIELD OF THE INVENTION

The present invention relates to multiplier circuit designs generally and, more particularly, to a method and/or apparatus for implementing a low depth combinational finite field multiplier.

BACKGROUND OF THE INVENTION

Modern application-specific integrated circuits (ASICs) integrate greater and greater security and data protection functionality into the hardware (HW). The integrated functionality provides more reliable and more efficient hardware security for both conventional "Data At-Rest" and conventional "Data In-Flight" protection.

Data storage systems are moving to distributed storage models that are based on storage networking. The move has an impact for enterprise data protection: the distributed models increase the vulnerability of stored data (i.e., Data At-Rest) to various attacks, both external and internal and both malicious and accidental. For Internet traffic and other moving data (i.e., Data In-Flight), the move provides such protection as sender and recipient mutual authentication, key exchange, data confidentiality, authenticated encryption (which is a type of encryption/decryption that additionally providing a way to check data integrity and authenticity) and replay protection.

In contemporary applications, the speed/throughput of the traversing data is up to 10 Gb/s (gigabits per second) and beyond. For some storage applications, the speed/throughput of the traversing data is even 10× higher: up to 100 Gb/s and beyond. The high speeds alone make security support of the data in software (SW) almost infeasible as far as security transformations are usually incorporated into the main data path and appear as bottlenecks from efficiency and performance standpoints.

Many cryptographic protocols use an encryption process and message authentication and data integrity services independently with each process using an independent key. To speed up overall computations, new cryptographic modes that combine and provide both crypto services using a single "combined" mode were proposed and became accepted by both the National Institute of Standards and Technology (NIST) and the Institute of Electrical and Electronics Engineering (IEEE) and other technical professional organizations and committees working in network and data storage security areas.

To prevent data lost and breach, IEEE P1619 "Standard Architecture for Encrypted Shared Storage Media" suggests using the XTS-AES (Advanced Encryption Standard) (XOR-Encrypt-XOR (XEX)-based Tweaked Electronic Code Book (ECB) mode with Cipher Text Stealing (CTS)). The P1619.1 "Standard for Authenticated Encryption with Length Expansion for Storage Devices" uses the Galois/Counter mode (GCM), Counter mode (CTR) with Cipher-Block Chaining (CBC)-Message Authentication Code (MAC) (CCM) and other cryptographic processes. Both drafts are now accepted standards: IEEE Std. 1619-2007 and IEEE Std. 1619.1-2007.

Among the new AES-based modes is the NIST approved (see NIST Special Publication SP800-38D defining Galois/Counter Mode (GCM) and Galois Message Authentication Code (GMAC)) GCM mode and IEEE P1619 legacy mode Liskov, Rivest, and Wagner (LRW), that both use Galois Field multiplication for processing 128-bit blocks of data. Besides memory and storage applications, GCM-AES is becoming more widely used in various Internet security protocols and was suggested/submitted as an Internet-draft to the Internet Engineering Task Force (IEFT) to use in the Secure RTP (SRTP) protocol (see Internet-Draft for GCM in Secure RTP (SRTP)), MACsec (see IEEE 802.1AE), Internet Key exchange version 2 (IKEv2), and in the IPsec (see RFC 4106 and RFC 4543).

A feature of the GCM mode is that the message authentication is performed in parallel with encryption/decryption of the main data payload by applying multiplication in a Galois Field (GF). Multiplications in finite fields have been used for fast (i.e., insecure) message hash computations. To make such computed massage hash values secure, application of the GCM GHASH process adds a pseudorandom vector, a so called "whitening" vector, at the end. The pseudorandom vector is generated by encrypting a preset value (i.e., Initialization Vector IV) with a secret AES key (i.e., vector W). Use of the GF multiplier for Message Authentication Code (MAC) computation permits higher throughput than the authentication process for computing a conventional MAC. The conventional MAC processes use slower chaining modes, like AES-CBC, or use a separate stand-alone secure hash process from the Secure Hash Algorithm (SHA) family.

SUMMARY OF THE INVENTION

The present invention generally concerns a method for generating a design of a multiplier. The method generally includes steps (A) to (C). Step (A) may generate a first circuit comprising a plurality of polynomial results of a particular multiplier scheme based on a plurality of parameters of the multiplier. The first circuit is generally configured to multiply a plurality of polynomials. Step (B) may generate a second circuit comprising a plurality of polynomial evaluators based on the parameters. The second circuit may be (i) connected to the first circuit and (ii) configured to evaluate a polynomial modulo operation. Step (C) may generate the design of the multiplier in combinational logic by optimizing a depth of a plurality of logic gates through the first circuit and the second circuit. A product of the polynomials generally resides in a finite field.

The objects, features and advantages of the present invention include providing a method and/or apparatus for implementing a low depth combinational finite field multiplier that may (i) be used in high throughput implementations, (ii) implement an area efficient circuit, (iii) provide flexible and parameter-based multiplier construction, (iv) provide scalable unified netlist generation and/or (v) enable easy testing and debugging.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Some embodiments of the present invention generally describe an implementation method for a low gate-depth finite field multiplier for the high throughput cryptographic applications. The method of multiplier implementation may be based on the Karatsuba scheme. The implementation generally leads to low depth of the combinatorial circuit that allows use in the high throughput implementations of GCM-AES, LRW-AES, Universal mobile telecommunications system Integrity Algorithm 2 (UIA2) (e.g., Snow 3G) and other cryptographic applications by providing an instantiated 1-cycle multiplier in such applications. The multiplication scheme may support many applications in data security and storage plus Internet and wireless applications related to data protection. Error correcting codes dealing with Galois Field multiplication may also be applicable.

The resulting circuits are generally performance and area efficient with memory free combinatorial circuits of low depth and reduced area compared with other multiplication techniques if implemented as single-cycle combinatorial circuits. The method may use flexible and parameterized multiplier construction that allows implementation of explicitly 2-4 out of the several nested iterations/steps of the Karatsuba process within a given clock period. A scalable unified netlist may be generated that allows multipliers to be created for different dimensions of the finite fields. For GCM and LRW, the dimension is generally matched to the processed data block size (e.g., 128 bits) and for UIA2 (Snow 3G) may match a 64-bit block size. The circuits generally provided for easy testing and debugging. For example, exhaustive testing for a small dimension may be performed and then scaling of the circuit should result in an error-free design for higher dimensions.

A multiplier in $GF(2^n)$ for cryptographic purposes (e.g., for GCM, LRW, UIA2 (Snow 3G)) and for error correcting and other applications (e.g., CRC computations) may be implemented in the following way. An initial "regular" multiplication in a finite set of integers $Z_2[x]$ is generally performed followed by a reduction for the proper modulo.

Figure 1:
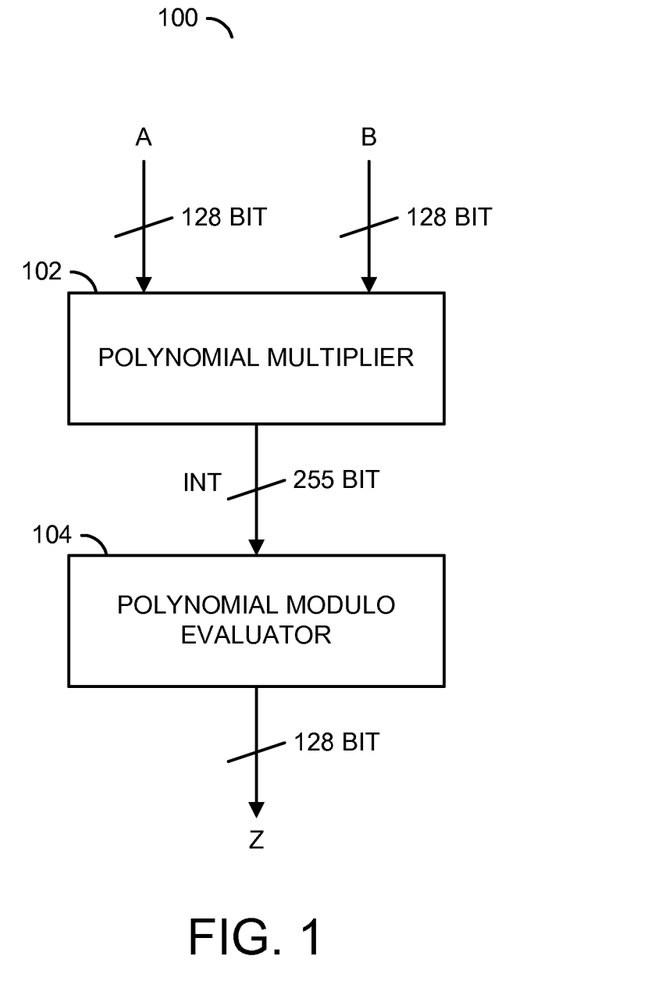
FIG. 1 is a block diagram of a multiplier circuit in a Galois Field.

Referring to FIG. 1, a block diagram of a circuit 100 is shown. The circuit (or device, apparatus or integrated circuit) 100 may implement a multiplier in a Galois Field. The circuit 100 generally comprises a block (or circuit) 102 and a block (or circuit) 104. The circuits 102 to 104 may represent modules and/or blocks that may be implemented as hardware, firmware, software, a combination of hardware, firmware and/or software, or other implementations.

A signal (e.g., A) may be received by the circuit 102. A signal (e.g., B) may also be received by the circuit 102. The circuit 102 may generate and present an intermediate signal (e.g., INT) to the circuit 104. A signal (e.g., Z) may be generated and presented by the circuit 104.

The circuit 100 is generally configured to multiply the values received in the signals A and B in a particular Galois Field (e.g., a $GF(2^{128})$). The $GF(2^{128})$ may be defined by an irreducible polynomial $X^{128}+X^7+X^2+x+1$. Each value in the input signals A and B may represent multiple-bit (e.g., 128 bit) values. The multiplication performed by circuit 102 generally creates a larger (e.g., 255 bit) intermediate value in the signal INT. The circuit 104 may perform a polynomial modulo operation on the intermediate value to produce an output value (e.g., 128 bits) in the signal Z.

To achieve the full strength of the benefits provided by multiplication-based hashing, some embodiments of the present invention implement the Galois Field multiplier with combinational circuits of low depth. In some embodiments, the low depth may be sufficient to meet a timing constraint that would allow the entire multiplication to be performed within a time window matching an intended clock period (e.g., in a single clock cycle).

Figure 2:
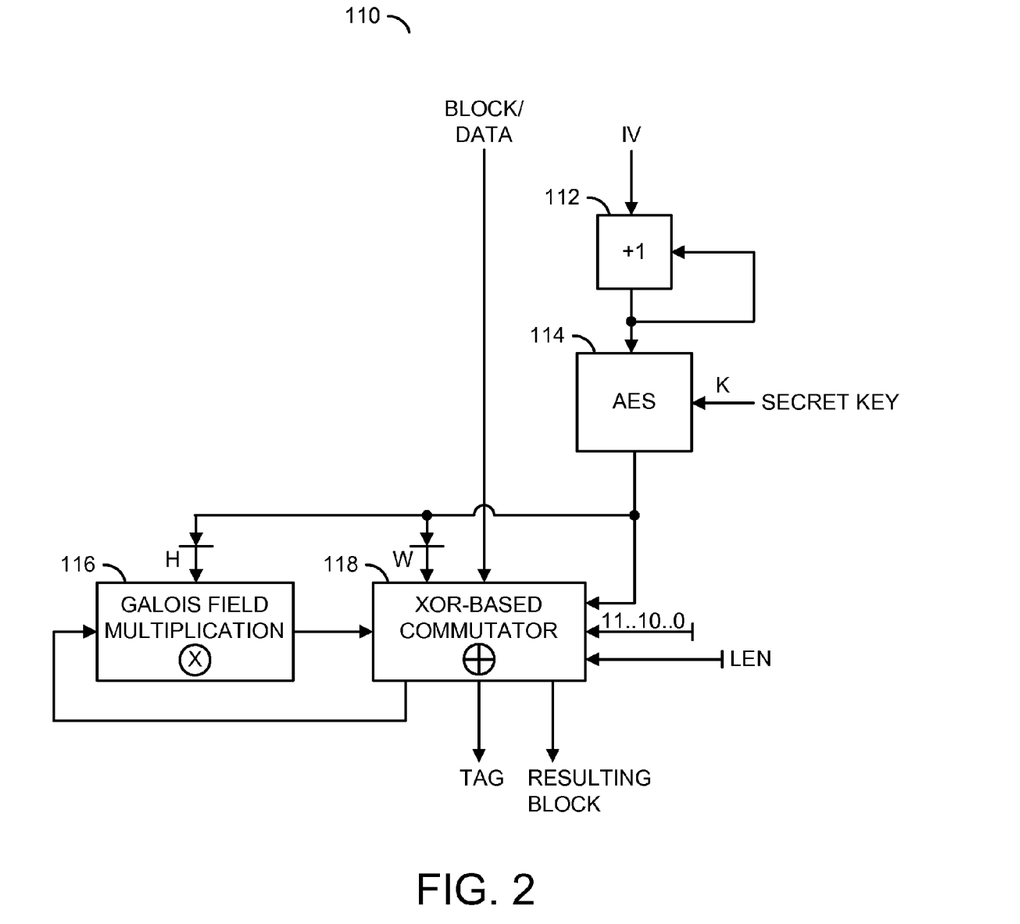
FIG. 2 is a block diagram of a Galois/Counter Mode-Advanced Encryption Standard circuit.

Referring to FIG. 2, a block diagram of a circuit 110 is shown. The circuit (or device, apparatus or integrated circuit) 110 may implement a Galois/Counter Mode-Advanced Encryption Standard circuit. The circuit 110 generally comprises a block (or circuit) 112, a block (or circuit) 114, a block (or circuit) 116 and a block (or circuit) 118. The circuits 112 to 118 may represent modules and/or blocks that may be implemented as hardware, firmware, software, a combination of hardware, firmware and/or software, or other implementations.

A signal (e.g., BLOCK/DATA) may carry multiple-bit (e.g., 128-bit) data for encryption/decryption or authentication. A signal (e.g., H) generally carries a Hash subkey H=AES(K,0). A whitening signal (e.g., W) may convey Whitening W=AES(K,IV). A length signal (e.g., LEN) generally carries LEN=Len(Auth Data)||Len(Data). Padding mask 11 ... 10 ... 0 may be a mask to align the last ciphertext block. The GF multiplication in circuit 112 is generally executed in the Galois Field $GF(2^{128})$. The GF $(2^{128})$ field may be used in both GCM and LRW AES modes may be defined by the irreducible polynomial $X^{128}+X^7+X^2+x+1$.

In a 2-cycle architecture of the circuit 110 (e.g., 128-bit input data coming every other clock cycle), a clock cycle is generally used for multiplication while another clock cycle is used to update the intermediate hash value and to be prepared to perform the next multiplication. With such an approach, the input payload data received in the signal BLOCK/DATA may have a speed of 128-bits every other clock, which at a 500 to 800 megahertz (MHz) clock frequency generally leads to the throughput values in the range of 30-50 gigabits per second (Gb/s). A further throughput increase may also be available (e.g., speed may be doubled) with a standard parallelization technique, two copies of the multiplier may be used to eliminate the clock cycle used to update the computed hash value.

The circuit 112 generally implements an increment circuit that increments a value received in the signal IV. The circuit 114 may implement an AES cipher circuit that utilizes a key from the signal K. The circuit 116 may be configured as a Galois Field multiplication circuit. The circuit 116 may be implemented as a low gate-depth finite field multiplier in accordance with one or more embodiments of the present invention. The circuit 118 generally implements an XOR-based commutator circuit that generates an output block (e.g., RESULTING BLOCK) and a tag (e.g., TAG).

Figure 3:
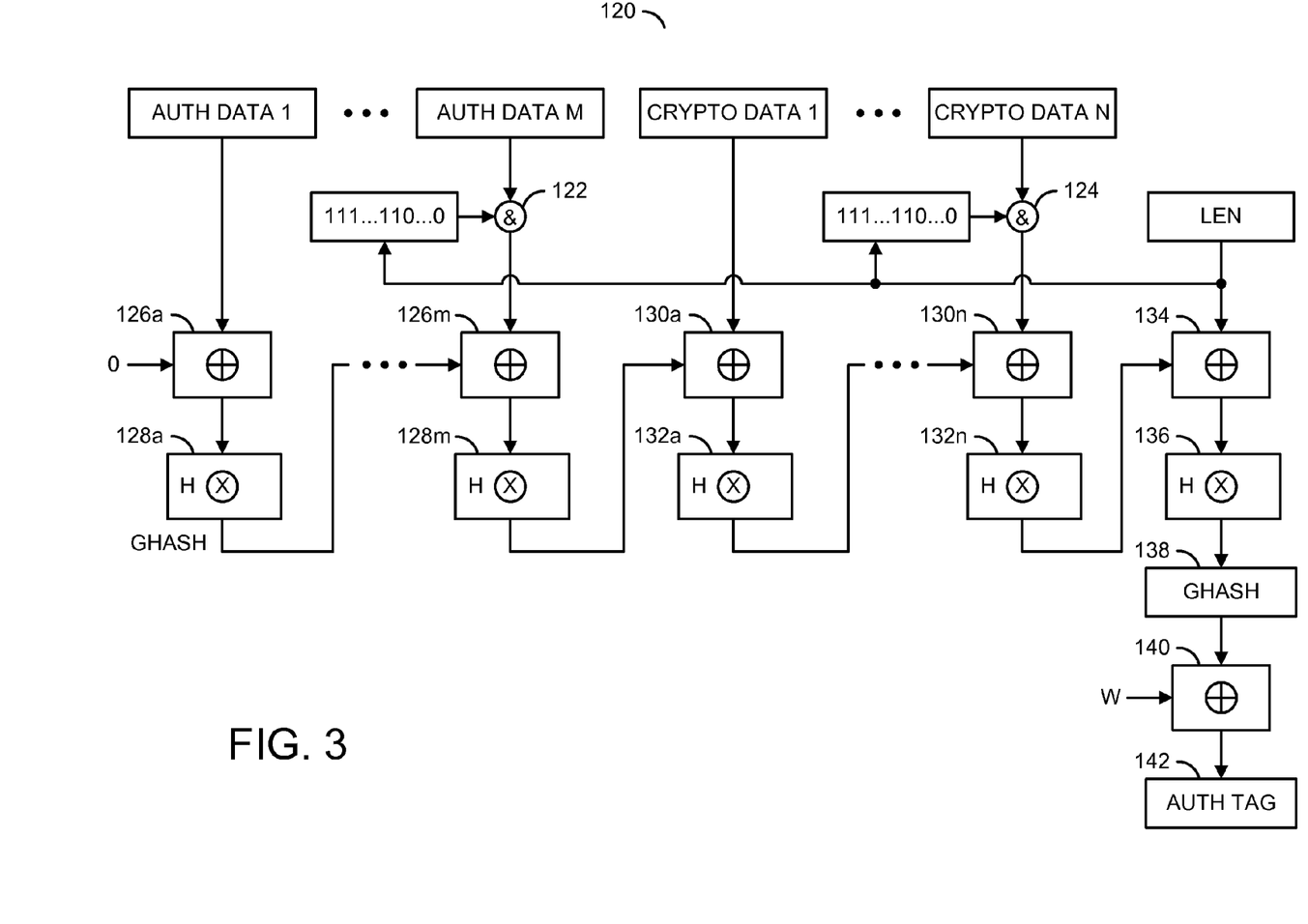
FIG. 3 is a block diagram of a 2-cycle GHASH circuit.

Referring to FIG. 3, a block diagram of a circuit 120 is shown. The circuit (or device, apparatus or integrated circuit) 120 may implement a 2-cycle GHASH circuit. The circuit 120 generally comprises a block (or circuit) 122, a block (or circuit) 124, multiple circuits (or modules) 126a to 126m, multiple circuits (or modules) 128a to 128m, multiple circuits (or modules) 130a to 130n, multiple circuits (or modules) 132a to 132n, a block (or circuit) 134, a block (or circuit) 136, a block (or circuit) 138, a block (or circuit) 140 and a block (or circuit) 142. The circuits 122 to 142 may represent modules and/or blocks that may be implemented as hardware, firmware, software, a combination of hardware, firmware and/or software, or other implementations.

The circuits 122 and 124 may be implemented as logical AND gates. The circuits 126a to 126m may receive authentication data (e.g., AUTH DATA 1 to AUTH DATA M) with the last piece of authentication data (e.g., AUTH DATA M) coming through the circuit 124. The circuits 130a to 130n generally receive cryptography data (e.g., CRYPTO 1 to CRYPTO N) with the last piece of cryptography data (e.g., CRYPTO N) coming through the circuit 126. The circuit 134 may receive a length data (e.g., LEN). Each circuit 126b to 126m, 130a to 130n and 134 may be operational to logically XOR the received data with GHASH data received from a previous circuit 128a to 128m and 130a to 130n. The circuit 128a may XOR the authentication data with a logical zero value. Each circuit 128a to 128m, 132a to 132n and 136 generally operates as Galois Field (e.g., $GF(2^{128})$) multiplier blocks. The circuits 128a to 128m, 132a to 132n and 136 may be implemented as low gate-depth finite field multipliers in accordance with one or more embodiments of the present invention. The circuit 138 may contain one or more flip-flops to buffer data. The circuit 140 generally receives whitening data (e.g., W) and XORs the whitening data with the GHASH value received from the circuit 138. The circuit 142 may generate an authentication tag (e.g., AUTH TAG) from the data generated by the circuit 140.

Figure 4:
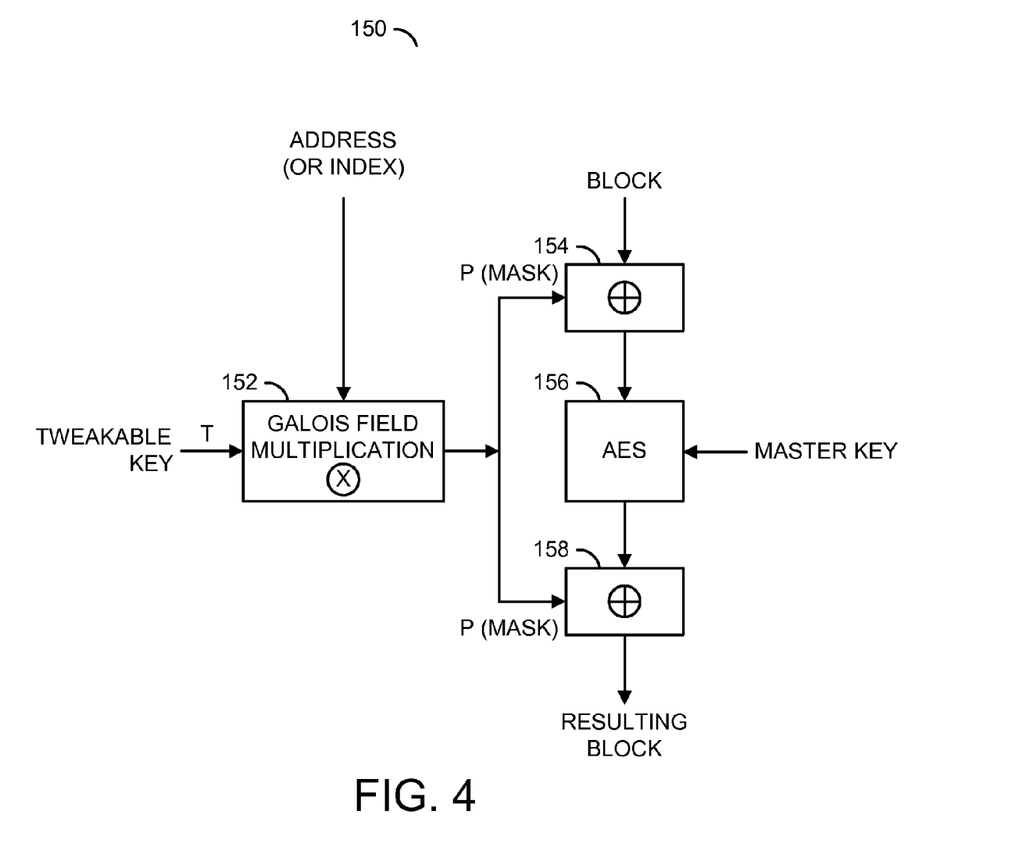
FIG. 4 is a block diagram of an Advanced Encryption Standard-LRW circuit.

Referring to FIG. 4, a block diagram of a circuit 150 is shown. The circuit (or device, apparatus or integrated circuit) 150 may implement an Advanced Encryption Standard-LRW circuit. The circuit 150 generally comprises a block (or circuit) 152, a block (or circuit) 154, a block (or circuit) 156 and a block (or circuit) 158. The circuits 152 to 158 may represent modules and/or blocks that may be implemented as hardware, firmware, software, a combination of hardware, firmware and/or software, or other implementations.

A signal (e.g., BLOCK) generally conveys a 128-bit block of a data unit into the circuit 154. A data unit typically corresponds to a Logical Block in a sector-level encryption of a disk. An address signal (e.g., ADDRESS) may be a sequential address of the block inside the data unit. The address may also be referred to as an index number (e.g., INDEX). A signal (e.g., T) generally carries a value of a multiple-bit (e.g., 128-bit) tweakable key. The circuit 152 may operate as a Galois Field (e.g., $GF(2^{128})$) multiplication that multiplies the address value by the tweakable key. The circuit 152 may be implemented as low gate-depth finite field multipliers in accordance with one or more embodiments of the present invention. The circuits 154 and 158 generally implement XOR circuits that logically XOR the data entering and exiting the circuit 156 with a mask received in a signal (e.g., P) from the circuit 152. The circuit 156 generally implements and AES circuit that uses a key (e.g., MASTER KEY).

Figure 5:
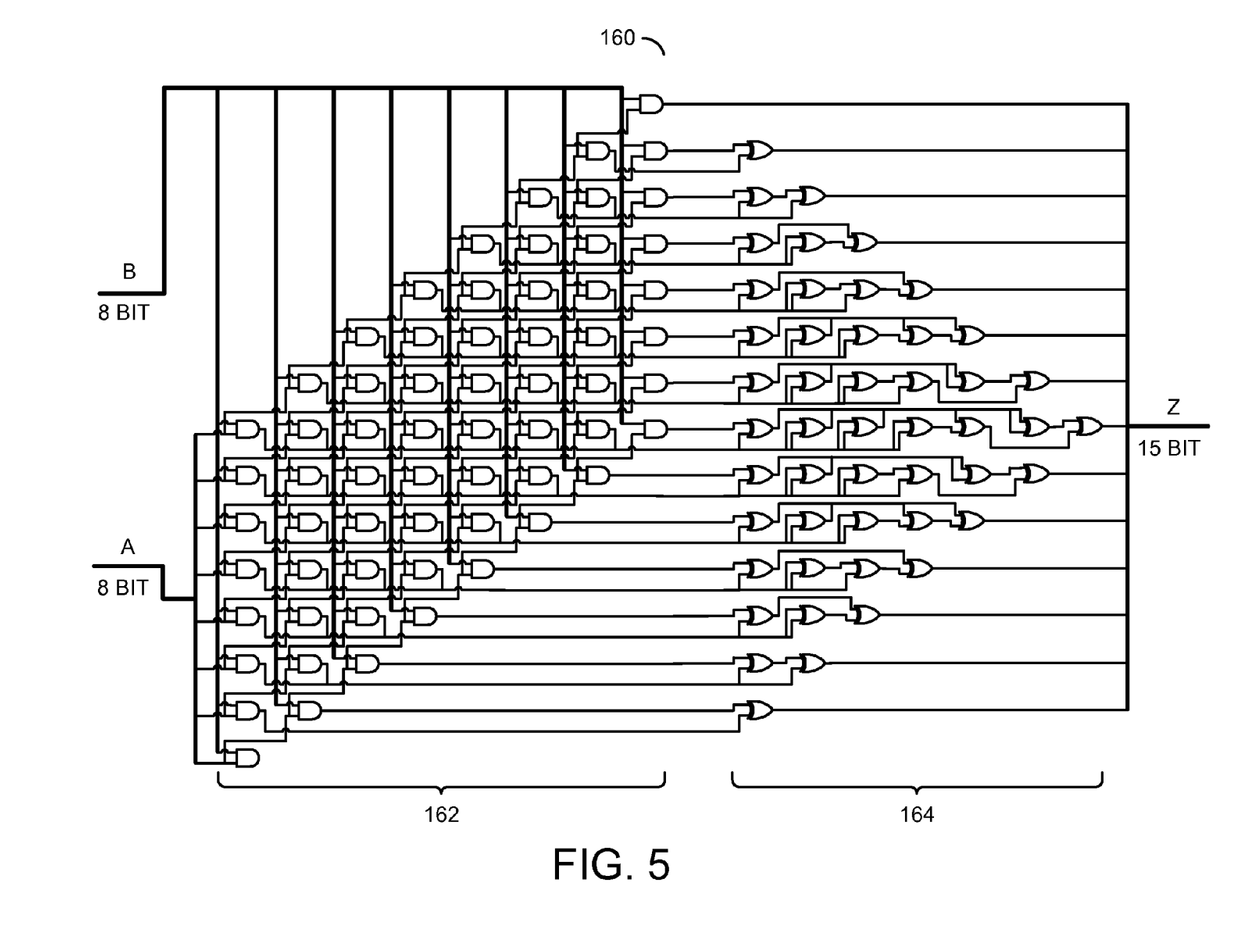
FIG. 5 is a block diagram of an AND-XOR multiplier circuit.

Referring to FIG. 5, a block diagram of a circuit 160 is shown. The circuit (or device, apparatus or integrated circuit) 160 may implement a multiplier circuit. The circuit 160 generally comprises multiple circuits (or modules) 162 and multiple circuits (or modules) 164. The circuits 162 to 164 may represent modules and/or blocks that may be implemented as hardware, firmware, software, a combination of hardware, firmware and/or software, or other implementations.

An input signal (e.g., A) may be received by a subset (e.g., leftmost column) of the circuits 162. Another input signal (e.g., B) may be received by all of the circuits 162. Each signal A and B generally conveys a multiple-bit (e.g., 8-bit) value. Each value in the signals A and B may be treated as the coefficients of corresponding polynomials. The circuits 164 may be connected to the circuits 162 to receive partial products. The circuits 164 may collectively generate a multiple-bit (e.g., 8-bit) output signal (e.g., Z). The value in the signal Z is generally a product of the value (or polynomial) in the signal A multiplied by the value (or polynomial) in the signal B.

The circuit 160 may be implemented in a normal manner in some embodiments of the present invention. Let N−1 be a degree of the polynomials to be multiplied. The circuits 162 generally comprise logical AND gates (or elements). The circuits 162 collectively may compute partial products for all pairs of polynomial coefficients. The circuits 164 generally implement logical XOR gates (or elements). The circuits 164 may receive the partial products for monomials with the same degree from the circuits 162. An approach for depth reduction in the circuit 160 may be to organize monomial addition in an optimal way. Optimal organization may be achieved by computing XOR in a form of a balanced binary tree (e.g., similar to a Wallace tree for number multipliers). By implementing a balanced binary tree, the circuit 160 generally has $n^2$ AND elements 162 and $(n-1)^2$ XOR elements 164. A resulting depth through the circuit 160 is generally a depth of an AND gate (denoted by $D_{AND}$) plus]$\log_2 N$[ depth of an XOR gate (denoted by $D_{XOR}$).

Figure 6:
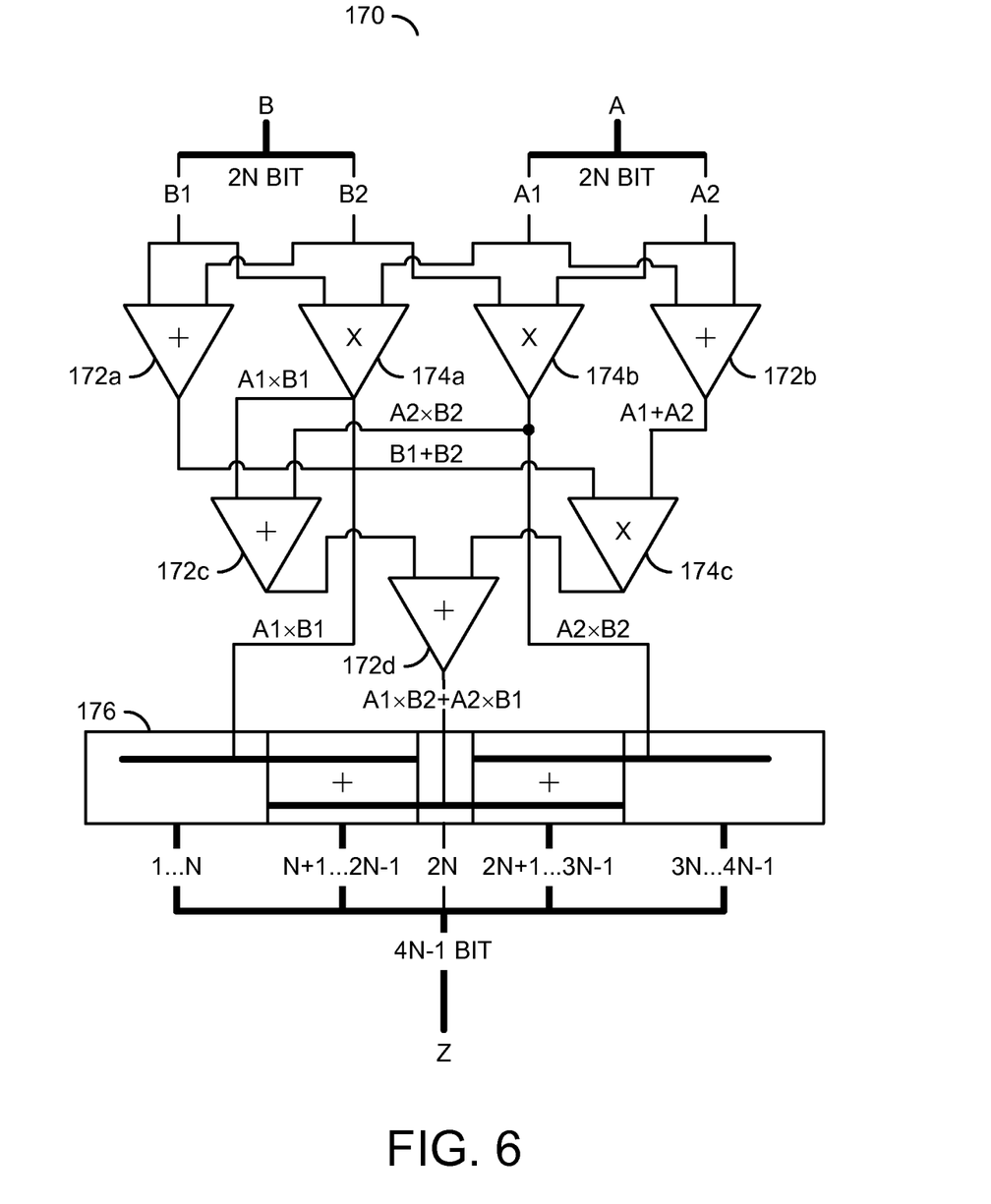
FIG. 6 is a block diagram of a Karatsuba multiplier circuit.

Referring to FIG. 6, a block diagram of a circuit 170 is shown. The circuit (or device, apparatus or integrated circuit) 170 may implement a Karatsuba multiplier circuit. The circuit 170 generally comprises multiple circuits (or modules) 172a to 172d, multiple circuits (or modules) 174a to 174c and multiple circuits (or modules) 176. The circuits 172a to 176 may represent modules and/or blocks that may be implemented as hardware, firmware, software, a combination of hardware, firmware and/or software, or other implementations.

The input signal A generally comprises two components, a signal (e.g., A1) and a signal (e.g., A2). The input signal B generally comprises two components, a signal (e.g., B1) and a signal (e.g., B2). Bits of the output signal Z may be generated by the circuits 176.

The circuits 172a to 172d generally implement two-input adder circuits. The circuit 176 may be operational to aggregate three values: "A1×B1", "A2×B2" and "A1×B2+A2× B1". The values may be considered as polynomial coefficients. An output of the circuit 176 may also be considered coefficients of a polynomial. The aggregation is generally calculated as follows:

$$(A2 \times X^N + A1) \times (B2 \times X^N + B1) = (A2 \times B2 \times X^{2N}) + ((A1 \times B2 + A2 \times B1) \times X^N) + (A1 \times B1),$$

where Ai and Bi may be N−1 degree polynomials from $Z_2[X]$. The aggregation generally performs modulo polynomial addition (coefficient XOR'ing) and may take into account that the value of some coefficients are zero. Accounting for the zero value coefficients generally reduces the number of summands from 3 to 2 or even 1 (for result coefficients from N+1 to 2N−1 and from 2N+1 to 3N−1 the sum may be of two summands, for others a single summand). When the resulting coefficient is a sum of a single summand, no XOR cells may be implemented as the operation generally reduces to an assignment.

The circuits 174a to 174c generally implement multiplication circuits. In some designs, each circuit 174a to 174c may itself be an iteration of the circuit 170. In other embodiments, one or more of the circuits 174a to 174c may be implemented as the circuit 160 or the like.

If a depth $D_{AND}]\log_2 N[D_{XOR}$ is increased without violating timing constraints, area optimization may be performed in exchange for minor depth growth. The area optimization is generally based on the Karatsuba method (or scheme). The Karatsuba method was discovered by Anatolii Alexeevitch Karatsuba in 1960. An idea of the Karatsuba method may be based on a formula as follows:

$$(Ex^N+F)(Gx^N+H)=(EGx^{2N}+FH)+((E+F)(G+H)+EG+FH)x^N$$

To multiply two 2N-bit polynomials, three multiplications of N-bit polynomials (e.g., EG, FH and (E+F)(G+H)) plus three small schemes for linear transformations may be implemented.

A vector of coefficients of the polynomial $EGx^{2N}+FH$ may be denoted by a vector $V_0$ as follows:

$$V_0=(v_{(0,4N-2)}, \ldots, v_{(0,2N)}, 0, v_{(0,2N-2)}, \ldots, v_{(0,0)}).$$

The vector of coefficients of the polynomial (E+F)(G+H) may be denoted by a vector $V_1$ as follows:

$$V_1=(v_{(1,2N-2)}, \ldots, v_{(1,0)}).$$

The vectors of polynomials EG and FH may be denoted by vectors $V_2$ and $V_3$ as follows:

$$V_2=(v_{(2,2N-2)}, \ldots, v_{(2,0)})=(v_{(0,4N-2)}, \ldots, v_{(0,2)}),$$

$$V_3=(v_{(3,2N-2)}, \ldots, v_{(3,0)})=(v_{(0,2N-2)}, \ldots, v_{(0,0)}).$$

A resulting vector $(c_{(4N-2)}, \ldots, c_0)$ for the polynomial $(Ex^N+F)(Gx^N+H)$ may be computed by component-wise XORing (e.g., $\oplus$) of the following vectors:

$(V_{(0,4N-2)}, \ldots, V_{(0,3N-1)}, V_{(0,3N-2)}, \ldots,$
$\qquad V_{(0,2N)}, 0, V_{(0,2N-2)}, \ldots, V_{(0,N)}, V_{(0,N-1)}, \ldots, V_{(0,0)})$
$\oplus (0, \ldots, 0, V_{(1,2N-2)}, \ldots, V_{(1,N)}, V_{(1,N-1)},$
$\qquad\qquad V_{(1,N-2)}, \ldots, V_{(1,0)}, 0, \ldots, 0),$
$\oplus (0, \ldots, 0, V_{(2,2N-2)}, \ldots, V_{(2,N)}, V_{(2,N-1)},$
$\qquad\qquad V_{(2,N-2)}, \ldots, V_{(2,0)}, 0, \ldots, 0),$
$\oplus (0, \ldots, 0, V_{(3,2N-2)}, \ldots, V_{(3,N)}, V_{(3,N-1)}, V_{(3,N-2)}, \ldots, V_{(3,0)}, 0, \ldots, 0).$ The same result may be achieved by XORing the following vectors:

$(V_{(0,4N-2)}, \ldots, V_{(0,3N-1)}, V_{(0,3N-2)}, \ldots,$
$\qquad V_{(0,2N)}, 0, V_{(0,2N-2)}, \ldots, V_{(0,N)}, V_{(0,N-1)}, \ldots, V_{(0,0)})$
$\oplus (0, \ldots, 0, V_{(1,2N-2)}, \ldots, V_{(1,N)}, V_{(1,N-1)},$
$\qquad\qquad V_{(1,N-2)}, \ldots, V_{(1,0)}, \ldots, 0, \ldots, 0),$
$\oplus (0, \ldots, 0, V_{(0,4N-2)}, \ldots, V_{(0,3N)}, V_{(0,3N-1)},$
$\qquad\qquad V_{(0,3N-2)}, \ldots, V_{(0,2N)}, 0, \ldots, 0),$
$\oplus (0, \ldots, 0, V_{(0,2N-2)}, \ldots, V_{(0,N)}, V_{,(0,N-1)},$
$\qquad\qquad V_{(0,N-2)}, \ldots, V_{(0,0)}, 0, \ldots, 0).$ Hence, the resulting vectors may be expressed as follows:

$$C_{(4N-2)} = V_{(0,4N-2)}, \ldots, C_{(3N-1)}$$
$$= V_{(0,3N-1)},$$

$$C_{(3N-2)} = (V_{(0,3N-2)} \oplus V_{(0,2N-2)}) \oplus V_{(1,2N-2)} \oplus V_{(0,4N-2)}, \ldots, C_{(2N)}$$
$$= (V_{(0,2N)} \oplus V_{(0,N)}) \oplus V_{(1,N)} \oplus V_{(0,3N)},$$

$$C_{(2N-1)} = V_{(1,N-1)} \oplus V_{(0,N-1)} \oplus V_{(0,3N-1)}, C_{(2N-2)}$$
$$= (V_{(0,3N-2)} \oplus, V_{(0,2N-2)}) \oplus V_{(1,N-2)} \oplus V_{(0,N-2)}, \ldots, C_{(N)}$$
$$= (V_{(0,2N)} \oplus V_{(0,N)}) \oplus V_{(1,0)} \oplus V_{(0,0)},$$

$$C_{(N-1)} = V_{(0,N-1)}, \ldots, C_{(0)}$$
$$= V_{(0,0)}.$$

Note that the sums in parentheses are generally the same for all coefficients, so computing the sums just once is sufficient for all vectors. As the result, a scheme S for computing all coefficients generally has (N−1)+2(2N−1)=5N−3 XOR elements and a depth of $2D_{XOR}$. Schemes for computing E+F and G+H may have 2N XOR elements and a depth of $1D_{XOR}$. Therefore, a total complexity of the linear schemes may be 7N−3 XOR elements.

Depths of the paths connected to the inputs of the scheme S may differ significantly. For example, the depth of the path computing $v_{(0,3N-2)}$ may be greater than the depths of the paths computing $v_{(1,2N-2)}$, $v_{(2,2N-2)}$ and $v_{(3,2N-2)}$. The greater depth may be because $v_{(0,3N-2)}$ is the central coefficient in the EG polynomial produced by multiplication, and other bits are leading coefficients for polynomials EG, FH and (E+F)(G+H). A depth for the central coefficients is generally greater than for leading coefficients. Note that the depths for coefficients $v_{(1,i)}$ may be the depths for the corresponding coefficients $V_{(2,i)}$, $v_{(3,i)}$ plus 1. Therefore, the depth for the sum of the coefficients may be reduced by a $D_{XOR}$ if XORing is performed in the following order:

$$v_{(0,3N-2)} \oplus (v_{(1,2N-2)} \oplus (v_{(0,4N-2)} \oplus v_{(0,2N-2)})).$$

In a similar way, the depth for other coefficients may be reduced. For example, the central coefficient may be computed as follows:

$$v_{(0,3N-2)}=(v_{(2,N-1)} \oplus v_{(3,N-1)} \oplus v_{(1,N-1)}.$$

However, depth reduction may lead to growth of the number of elements because some sums of the form $v_{(0,i+N)} \oplus v_{(0,i)}$ for i=N, . . . , 2N−2 may not be computed and the sums may be used twice to reduce the number of XOR elements by N−1.

As illustrated in FIG. 6, a Karatsuba multiplier $M_{2N}$ (e.g., circuit 170) for polynomials of degree 2N−1 generally has three multipliers $M_N$ (e.g., circuits 174a to 174c) and 8N−4 XOR elements (e.g., generally two XOR elements within each circuit 172a to 172d and 176). A depth of $M_{2N}$ generally matches the depth of the multipliers $M_N$ plus $3D_{XOR}$, so every additional application of Karatsuba method increases the depth by $2D_{XOR}$ in comparison with the circuit 160. Therefore, a complexity of the circuit 170 generally increases a little over three times when the polynomial degree doubles. For comparison, the complexity of the circuit 160 generally grows four times when the polynomial degree doubles. Therefore, a single application of the Karatsuba method may decrease the complexity by approximately ¼ for the price of minor depth growth; two applications may decrease complexity by nearly 7/16; and three applications by nearly 37/64. The final iteration of the Karatsuba method may incorporate the circuit 160.

Figure 7:
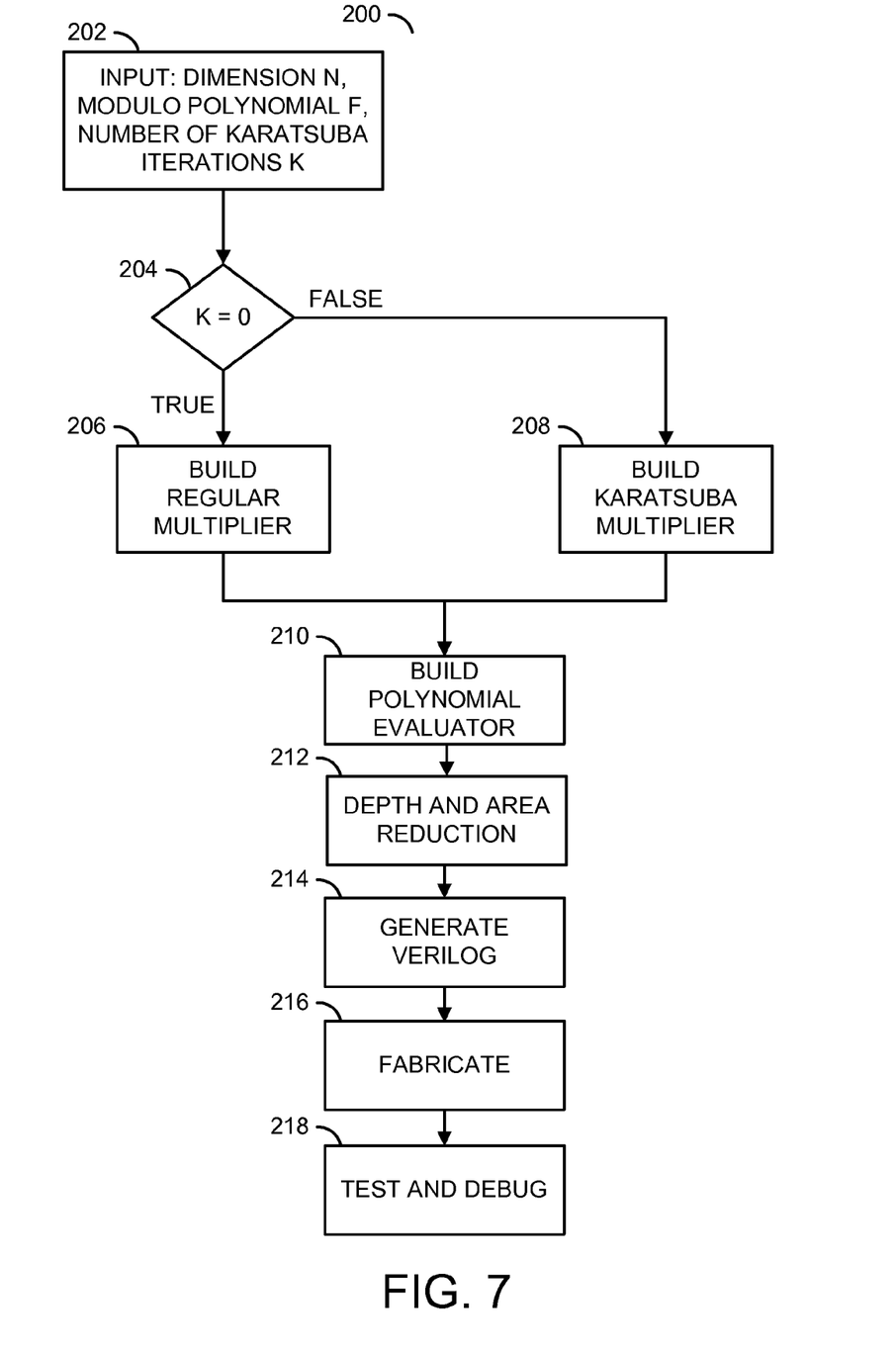
FIG. 7 is a flow diagram of a method in accordance with a preferred embodiment of the present invention.

Referring to FIG. 7, a flow diagram of a method 200 is shown in accordance with a preferred embodiment of the present invention. The method (or process or scheme) 200 may define a low depth combinational finite field multiplier. Method 200 generally comprises a step (or state) 202, a step (or state) 204, a step (or state) 206, a step (or state) 208, a step (or state) 210, a step (or state) 212, a step (or state) 214, a step (or state) 216 and a step (or state) 218. The steps 202 to 218 may represent modules and/or blocks that may be implemented as hardware, firmware, software, a combination of hardware, firmware and/or software, or other implementations.

In the step 202, parameters of a low depth combinational finite field multiplier may be entered. The parameters generally include the dimension N of the input polynomials to be multiplied, a modulo polynomial (e.g., F) and a number of iterations (e.g., K) within the multiplier. A check may be performed in step 204 of the parameter K.

If no iterations (e.g., K=0) are specified (e.g., the TRUE branch of step 204), the method 200 generally continues with the step 206. In the step 206, a regular multiplier (e.g., circuit 160) may be built. If one or more iterations are specified (e.g., the FALSE branch of step 204), method 200 generally continues with step 208. In the step 208, a Karatsuba multiplier (e.g., circuit 170) may be built.

Once an initial design of the multiplier has been built, a polynomial evaluator (e.g., circuit 104) may be built in the step 210 based on the parameter F. One or more depth and area reductions may be performed in the step 212 to reduce the gate-depth and/or area of the overall design. In the step 214, a file containing a Verilog or other similar hardware descriptor language version of the design may be generated. The design of the low depth combinational finite field multiplier is generally part of a bigger design for a circuit, device or apparatus. Die are generally fabricated based on the Verilog file in the step 216. Testing and debugging generally occurs in the step 218 for the entire design.

Figure 8:
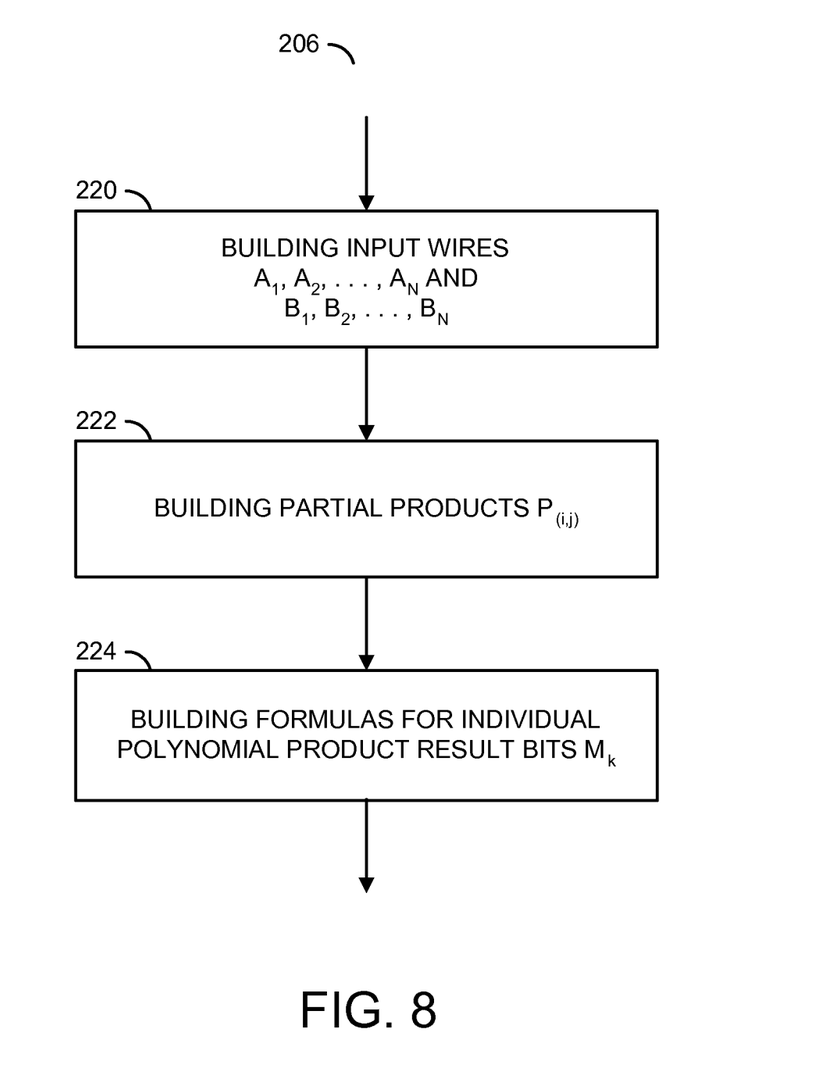
FIG. 8 is a detailed flow diagram of an optimal depth multiplier build.

Referring to FIG. 8, a detailed flow diagram of the optimal multiplier build step 206 is shown. The step 206 generally comprises a step (or state) 220, a step (or state) 222 and a step (or state) 224. The steps 220 to 224 may represent modules and/or blocks that may be implemented as hardware, firmware, software, a combination of hardware, firmware and/or software, or other implementations.

In the step 220, input wires for the signals A and B may be built. Each set of wires generally has N individual wires, a wire for each coefficient (bit) of the polynomial (value) received by the multiplier. The step 222 may build the partial products $P_{(i,j)} = A_i$ AND $B_j$, for $1 \leq i \leq N$, $1 \leq j \leq N$ using the AND gates 162. The symbol "&" shown in step 230 generally represents a logical AND operation. Step 224 builds the polynomial product result bits as follows:

$$M_k = P_{(k,1)} \oplus P_{(k-1,2)} \oplus \ldots \oplus P_{(1,k)}, \text{ for } 1 \leq k \leq N,$$

$$M_k = P_{(N,(k+1-N))} \oplus P_{(N-1,(k+1-N)+1)} \oplus \ldots \oplus P_{((k+1-N),N)}, \text{ for } N < k < 2N.$$

Figure 9:
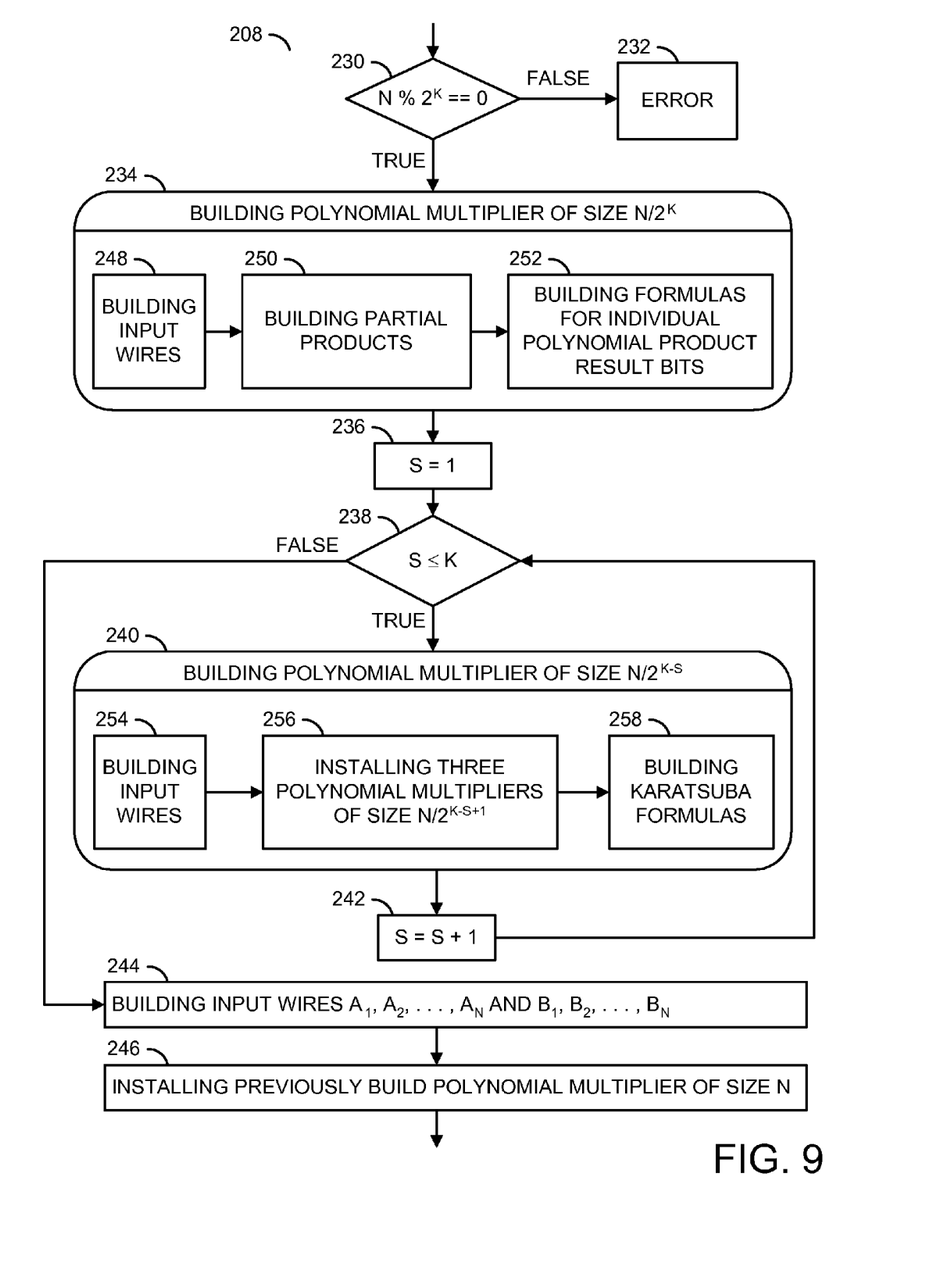
FIG. 9 is a detailed flow diagram of a Karatsuba multiplier build.

Referring to FIG. 9, a detailed flow diagram of the Karatsuba multiplier build step 208 is shown. The step 208 generally comprises a step (or state) 230, a step (or state) 232, a step (or state) 234, a step (or state) 236, a step (or state) 238, a step (or state) 240, a step (or state) 242, a step (or state) 244 and a step (or state) 246. The step 234 generally comprises a step (or state) 248, a step (or state) 250 and a step (or state) 252. The step 240 generally comprises a step (or state) 254, a step (or state) 256 and a step (or state) 258. The steps 230 to 258 may represent modules and/or blocks that may be implemented as hardware, firmware, software, a combination of hardware, firmware and/or software, or other implementations.

In the step 230, a check may be performed on the size of the polynomial parameter N and the iteration parameter κ. If N mod ($2^K$) is not zero (e.g., the FALSE step of step 230), the method generally reports an error in the step 232. The symbol "%" shown in step 230 generally represents a modulus operation. If N mod ($2^K$) is zero (e.g., the TRUE branch of step 230), the method 208 may continue with the step 234.

In the step 234, a polynomial multiplier of size $N/2^K$ may be built. Building of the above polynomial multiplier generally includes building the wire inputs in the step 248, building the partial products in the step 250 and building the formulas for the individual polynomial product result bits in the step 252.

A counter (e.g., S) may be initialized (e.g., S=1) in the step 236. A check of the counter S relative to the parameter K may be performed in the step 238. If S≤K (e.g., the TRUE branch of step 238), the method 208 generally continues with the step 240.

In the step 240, an iteration build of a polynomial multiplier of size $N/2^{(K-S)}$ may be performed. Building of the above polynomial multiplier generally includes building the wire inputs in the step 254, installing multiple (e.g., three) polynomial multipliers of size $N/2^{(K-S+1)}$ in the step 256 and building the Karatsuba formulas in the step 258.

The counter S may be incremented in the step 242 and the method 208 return to the step 238 where the just-incremented counter S is checked again. If S>K (e.g., the FALSE branch of step 238), the method 208 generally continues with the step 244. In the step 244, the wires for the signals A and B may be built. Each set of the wires generally has N individual wires, a wire for each coefficient (bit) of the polynomial (value) received by the multiplier. The previously built polynomial multiplier of size N may be installed and connected to the wires of the signals A and B in the step 246.

Figure 10:
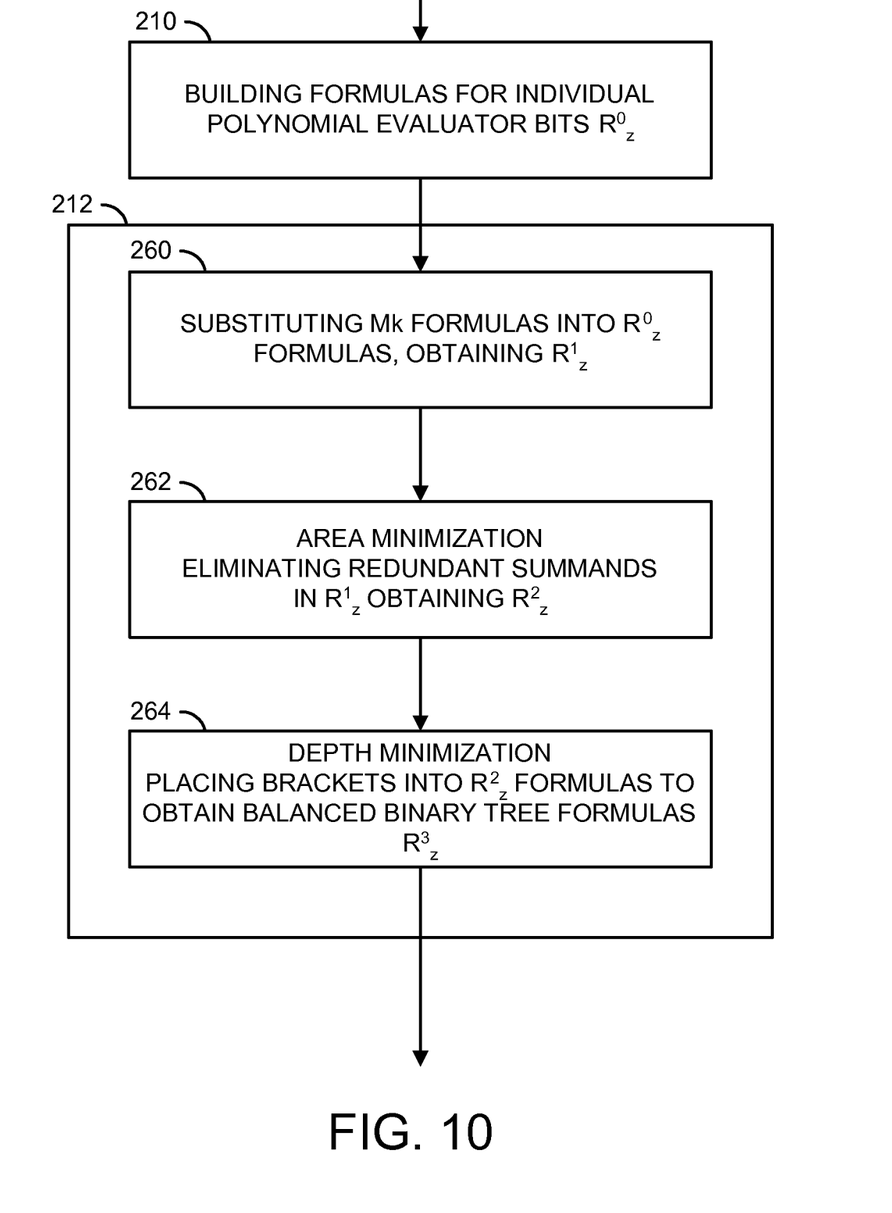
FIG. 10 is a detailed flow diagram of a polynomial evaluator build and a depth and area reduction.

Referring to FIG. 10, a detailed flow diagram of (i) the polynomial evaluator build step 210 and (ii) the depth and area reduction step 212 is shown. The step 212 generally comprises a step (or state) 260, a step (or state) 262 and a step (or state) 264. The steps 260 to 264 may represent modules and/or blocks that may be implemented as hardware, firmware, software, a combination of hardware, firmware and/or software, or other implementations.

In the step 210, the formulas for the individual polynomial evaluator bits may be built as follows:

$$R^0_z = M_z \oplus M_{k(z,1)} \oplus \ldots, \text{ for } 1 \leq z \leq N.$$

Modulo reduction is a linear operator. By creating a multiplier for a Galois Field GF($2^N$), modulo reduction generally maps a (2N−1)-dimensional linear space over a binary field to an N-dimensional linear space over the binary field. Therefore, reduction may be implemented in any one or more ways. A particular way is by establishing an operator matrix for the transformation. The formulae for multiplication of the matrix and a (2N−1)-dimensional vector may be computed. The depth may be subsequently optimized by performing XOR-ing in a form of a balanced binary tree. Consider LRW and GCM multiplication, using the above approach a scheme with a depth $3D_{XOR}$ having 127×4+21 XOR elements may be achieved.

For depth and area reduction, substituting the $M_k$ formulas into the polynomial evaluator bits $R^0_z$ may be performed in the step 260. The substitutions may generate updated polynomial evaluator bits $R^1_z$. In the step 262, area minimization is generally accomplished by eliminating redundant summands in the polynomial evaluator bits $R^1_z$ recognizing that $X \oplus X=0$. The eliminations may generate further updated polynomial evaluator bits $R^2_z$. In the step 264, further depth minimization may be accomplished by reorganizing the operations in the polynomial evaluator bit builds $R^2_z$ to obtain balanced binary tree formulas $R^3_z$.

Other depth optimization approaches may be implemented to meet the criteria of a particular application. By way of example, consider the circuit 160. The circuit 160 generally has $N^2$ AND elements placed in parallel with the corresponding output wire connected to a subschema implementing a linear transformation from $\{0,1\}^{(N^2)}$ to $\{0,1\}^{(2N-1)}$. Therefore, the latter subschema may be united with the scheme performing modulo reduction (e.g., another linear transformation). Depth reduction may then be performed separately for all outputs wires of the resulting scheme. A result may be a scheme with practically minimal depth.

Another technique generally addresses a multiplier constructed using Karatsuba method. The scheme of a linear transformation from the module implementing Karatsuba multiplier may be united with the scheme of a linear transformation for modulo reduction. Composition of such schemes may still be a linear transformation made up of XOR elements with a depth that may be optimized similarly to depth optimization described above.

Depth and area variations for several cases are generally illustrated in Table 1 and Table 2. For LRW and GCM multipliers (Table 1) and UTA-2 multipliers (Table 2) a gate depth was computed in AND-XOR gates. The depth of the XOR gates was considered to be 2. The number of iterations in the tables may be the number of times that the Karatsuba method was applied. Zero iterations generally indicate an AND-XOR multiplier (e.g., circuit 160).

TABLE 1

| Number of iterations | AND elements | XOR elements | Depth |
|---|---|---|---|
| 0 | 16384 | 16650 | 21 |
| 1 | 12228 | 12934 | 25 |
| 2 | 9216 | 10432 | 29 |
| 3 | 6912 | 8974 | 33 |
| 4 | 5184 | 8488 | 37 |
| 5 | 3888 | 8974 | 41 |

TABLE 2

| Number of iterations | AND elements | XOR elements | Depth |
|---|---|---|---|
| 0 | 4096 | 4227 | 19 |
| 1 | 3072 | 3393 | 23 |
| 2 | 2304 | 2907 | 27 |
| 3 | 1728 | 2745 | 31 |
| 4 | 1296 | 2907 | 35 |

Some embodiments of the present invention may implement a low depth Galois field multiplier that allows efficient implementation of the GCM-AES mode (and legacy LRW-AES), UIA2 (Snow 3G) and corresponding applications in data security, storage and Internet and wireless applications related to data protection. The Karatsuba multiplication scheme may be particularly suitable for the hardware implementation of the low depth combinatorial finite field multiplication operations in a Galois Field. Iterations of the Karatsuba scheme may be implemented in hardware with timing within 1 clock cycle. Therefore, support generally exists for 2-cycle architectures for cryptographic and error correcting applications (e.g., 1 cycle is used for the multiplication itself while another cycle is used for updating the processed data). For example, a 64-bit per clock rate for the input data flow may be achieved. The high bit per clock rate generally supports a GCM-AES throughput of +40 Gb/s at 700 MHz for G40 technology. The above combinatorial circuit for the Galois Field multiplication may also be used for fast multiplication in the GF in various applications that benefit from such operation such as error correction codes including, but not limited to, BCH codes.

The functions performed by the diagrams of FIGS. 7 to 10 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally executed from a medium or several media by one or more of the processors of the machine implementation.

The present invention may also be implemented by the preparation of ASICs (application specific integrated circuits), Platform ASICs, FPGAs (field programmable gate arrays), PLDs (programmable logic devices), CPLDs (complex programmable logic device), sea-of-gates, RFICs (radio frequency integrated circuits), ASSPs (application specific standard products), monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, storage and/or playback devices, video recording, storage and/or playback devices, game platforms, peripherals and/or multi-chip modules. Those skilled in the relevant art(s) would understand that the elements of the invention may be implemented in other types of devices to meet the criteria of a particular application.

As would be apparent to those skilled in the relevant art(s), the signals illustrated in FIGS. 1 to 6 represent logical data flows. The logical data flows are generally representative of physical data transferred between the respective blocks by, for example, address, data, and control signals and/or busses. The system represented by the apparatuses 180 and 220 may be implemented in hardware, software or a combination of hardware and software according to the teachings of the present disclosure, as would be apparent to those skilled in the relevant art(s).

While the invention has been particularly shown and described with reference to the preferred embodiments thereof, it will be understood by those skilled in the art that various changes in form and details may be made without departing from the scope of the invention.

The invention claimed is:

1. A computer-implemented method for generating a hardware multiplier circuit, the computer comprising a processor and a memory device, the method comprising:
   selecting, by the processor, a Karatsuba multiplier scheme from among a plurality of multiplier schemes in response to an iteration parameter being greater than zero, wherein said plurality of multiplier schemes includes the Karatsuba multiplier scheme and a non-Karatsuba multiplier scheme;
   generating, by the processor, a first circuit configured to (i) multiply a plurality of coefficients of two polynomials to generate a plurality of partial products based on a plurality of parameters of said Karatsuba multiplier scheme, and (ii) combine said partial products to generate an intermediate product, wherein each polynomial comprises n components, and wherein a number of said partial products generated is less than 2n;
   generating, by the processor, a second circuit configured to perform a polynomial modulo operation on said intermediate product to generate a final product of said polynomials based on said parameters and a modulo polynomial, wherein said final product of said polynomials resides in a finite field, and wherein said second circuit is connected to said first circuit; and
   reducing, by the processor, a depth of a plurality of logic gates through said first circuit and said second circuit to generate a reduced depth combinational logic circuit, wherein said hardware multiplier circuit comprises said reduced depth combinational logic circuit.

2. The method according to claim 1, wherein said Karatsuba multiplier scheme comprises a multiplier of size N/2K, where N is a dimension of said polynomials and K is a number of iterations of a multiplier circuit in said particular multiplier scheme.

3. The method according to claim 2, wherein at least one of said iterations of said multiplier circuit is implemented using a plurality of logical AND gates and a plurality of logical XOR gates.

4. The method according to claim 1, wherein said reducing comprises the step of:
   generating a plurality of modified evaluators by substituting one or more formulas that calculate bits of said intermediate product into a plurality of polynomial evaluators in said second circuit.

5. The method according to claim 4, wherein said reducing further comprises the step of:
   eliminating one or more redundant summands in said modified evaluators in said second circuit.

6. The method according to claim 5, wherein said reducing further comprises the step of:
   reorganizing a sequence of operations in said modified evaluators in said second circuit such that said modified evaluators form balanced binary tree formulas.

7. The method according to claim 1, wherein said partial products are implemented as a plurality of logical AND gates and said intermediate product is implemented as a plurality of logical XOR gates.

8. The method according to claim 1, wherein each polynomial received by said first circuit comprises a dimension of N, wherein said intermediate product comprises a dimension of 2N−1, and wherein said final product of said polynomials generated by said second circuit comprises a dimension of N.

9. An apparatus, comprising:
   a memory device configured to store program instructions; and
   at least one processor device coupled to the memory device, wherein the at least one processor device is configured to execute the stored program instructions to implement a process for building a hardware multiplier circuit, the process comprising:
   selecting, by the processor, a Karatsuba multiplier scheme from among a plurality of multiplier schemes in response to an iteration parameter being greater than zero, wherein said plurality of multiplier schemes includes the Karatsuba multiplier scheme and a non-Karatsuba multiplier scheme;
   generating a first circuit configured to (i) multiply a plurality of coefficients of two polynomials to generate a plurality of partial products based on a plurality of parameters of said Karatsuba multiplier scheme, and (ii) combine said partial products to generate an intermediate product, wherein each polynomial comprises n components, and wherein a number of said partial products generated is less than 2n;
   generating a second circuit configured to perform a polynomial modulo operation on said intermediate product to generate a final product of said polynomials based on said parameters and a modulo polynomial, wherein said final product of said polynomials resides in a finite field, and wherein said second circuit is connected to said first circuit; and
   reducing a depth of a plurality of logic gates through said first circuit and said second circuit to generate a reduced depth combinational logic circuit, wherein said hardware multiplier circuit comprises said reduced depth combinational logic circuit.

10. The apparatus of claim 9, wherein each polynomial received by said first circuit comprises a dimension of N, wherein said intermediate product comprises a dimension of 2N−1, and wherein said final product of said polynomials generated by said second circuit comprises a dimension of N.

* * * * *